(12) United States Patent
Gabler et al.

(10) Patent No.: US 6,300,959 B1
(45) Date of Patent: Oct. 9, 2001

(54) METHOD AND SYSTEM CONDENSING ANIMATED IMAGES

(75) Inventors: Jeffrey R. Gabler; Darrell J. Starnes, both of Tomball, TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/132,952

(22) Filed: Aug. 12, 1998

Related U.S. Application Data
(60) Provisional application No. 60/085,309, filed on May 13, 1998.

(51) Int. Cl.[7] .................................................. G06T 17/00
(52) U.S. Cl. .............................................................. 345/473
(58) Field of Search .................................. 345/428, 429, 345/472, 473, 474

(56) References Cited

U.S. PATENT DOCUMENTS

| | | | |
|---|---|---|---|
| 5,752,244 | * | 5/1998 | Rose et al. .................................. 707/5 |
| 5,764,235 | | 6/1998 | Hunt et al. . |
| 6,049,342 | * | 4/2000 | Nielsen et al. ........................ 345/473 |

OTHER PUBLICATIONS

R. Fielding et al., "Hypertext Transfer Protocol–HTTP/1.1", HTTP Working Group, Aug. 12, 1996, pp. 1–110.
"WinGate 2.1 is Officially Released", www.wingate.net, 1997.
"WinGate Opens the Internet Door", LAN Times (www.lanstimes.com/97/97jan/701b066a.html), Jan. 1997.
"Microsoft Proxy Server 1.0", Microsoft Corporation (www.microsoft.com/products/prodref/130_ov.htm.).
"Microsoft Announces Proxy Server 2.0", Microsoft Corporation (www.microsoft.com/corpinfo/press/1997/oct97/proxy2pr.htm), Oct. 8, 1997.
"Microsoft Proxy Server 2.0; What's New", Microsoft Corporation (www.microsoft.com/proxy/guide/whatsnew:asp?a=2&B=1).
Microsoft Proxy Server 2.0; Technical Papers, Cache Array Routing Protocol (CARP) Whitepaper, Microsoft Corporation (www.microsoft.com/proxy/guide/CarpWP.asp?A=2&B=3).
"GIF Grammar", pp. 1–2.
"All About GIF89a", www.ecafe.org/tools/gifanim/gifabout.htm, (downloaded May 7, 1998).
Graphics Interchange Format (GIF) Standard, (www.ecafe.org/tools/gifanim/gif87a.txt) Jun. 15, 1997.
Graphics Interchange Format (GIF), Version 89a, CompuServe Incorporated, Jul. 31, 1990.

* cited by examiner

*Primary Examiner*—Cliff N. Vo
(74) *Attorney, Agent, or Firm*—Akin, Gump, Strauss, Hauer & Feld, L.L.P.

(57) ABSTRACT

Improved techniques for condensing or reducing animated image data streams are disclosed. The improved techniques enable the transmission and storage of animated images in a rapid and efficient manner. Animated images are normally stored as image files that include a series of images which produce an animation effect when sequentially displayed. For example, animated image files are often used by Internet sites to provide animation to their web pages. In the case of a proxy server for a network (e.g., the Internet) that caches images, the condensing or reducing of the animated image files is particularly helpful because it not only to reduces image storage space but also accelerates the delivery of these animated images to end users. The improved techniques are particularly well suited for use in reducing or condensing animated GIF images.

28 Claims, 7 Drawing Sheets

METHOD AND SYSTEM CONDENSING ANIMATED IMAGES

This application claims the benefit of U.S. Provisional Application No. 60/085,309, entitled "METHOD AND APPARATUS FOR STORAGE AND DELIVERY OF CONTENT:, and filed on May 13, 1998, the disclosure of which is incorporated herein by reference for all purposes.

This application is related to pending U.S. patent application Ser. No. 09/133,498, filed concurrently herewith, entitled "METHOD AND APPARATUS FOR PROVIDING ACCELERATED CONTENT DELIVERY OVER A NETWORK," and assigned to the assignee of the present application, which is hereby incorporated herein by reference for all purposes.

This application is related to pending U.S. patent application Ser. No. 09/133,791, filed concurrently herewith, entitled "ACCELERATED CONTENT DELIVERY OVER A NETWORK USING REDUCED SIZE OBJECTS," and assigned to the assignee of the present application, which is hereby incorporated herein by reference for all purposes.

This application is also related to U.S. patent application Ser. No. 09/133,482, now U.S. Pat. No. 6,144,996, entitled "METHOD AND APPARATUS FOR PROVIDING A GUARANTEED MINIMUM LEVEL OF PERFORMANCE FOR CONTENT DELIVERY OVER A NETWORK," and assigned to the assignee of the present application, which is hereby incorporated herein by reference for all purposes.

This application is also related to pending U.S. patent application Ser. No. 09/133,497, filed concurrently herewith, entitled "METHOD AND APPARATUS FOR EFFICIENT STORAGE AND RETRIEVAL OF OBJECTS IN AND FROM AN OBJECT STORAGE DEVICE," and assigned to the assignee of the present application, which is hereby incorporated herein by reference for all purposes.

This application is also related to pending U.S. patent application Ser. No. 09/133,514, filed concurrently herewith, entitled "IMAGE FORMAT CONVERSION WITH TRANSPARENCY COLOR ADJUSTMENT," and assigned to the assignee of the present application, which is hereby incorporated herein by reference for all purposes.

BACKGROUND OF THE INVENTION

1. Field of the Invention

The present invention relates to graphical images and, more particularly, to condensing graphical images that are animated.

2. Description of the Related Art

Graphic images are often stored as image files in a variety of different formats. Often these formats contain some sort of compression to keep the size of the image files manageable. For example, JPEG compression or wavelet compression are currently popular compression techniques for image files.

To provide the appearance of animation on a display screen of a computer system, a series of images can be sequentially displayed. One format for graphical images that supports animation is GIF89a, which pertains to Graphics Interchange Format (GIF), version 89a, by Compuserve Incorporated, Columbus, Ohio. Since animations typically include a relatively large number of images to be sequentially displayed, the image files storing the animated images often use compression. The GIF89a format, for example, does utilize compression.

One problem with animated image files is that even with compression the file sizes are still large. These large files not only require a large amount of storage space, but also make the transmission of these files from one computer to another time consuming. With the development of the Internet and the frequency with which animated images are provided on World Wide Web (WWW) pages, there is an ever increasing need to improve the transmission time of animated image files.

Prior approaches have tried to re-compress image files to reduce their size. These require the computationally complex operations of decompression followed by re-compression. Although improvement in file size can be obtained, the computational requirements are often too burdensome. Additionally, prior approaches have sacrificed image quality (e.g., number of colors, resolution, size, etc.) in attempting to reduce image file size.

The storage and transmission difficulties associated with animated image files is particularly problematic in the case where a server system operates as a proxy system. A proxy system stores images relatively local to its requesters so that if the same images are again needed, they are readily available and can be rapidly forwarded to the appropriate requestor without the delay of having to first obtain the images from a content provider. Hence, in a server system desiring to store (e.g., cache) images for subsequent transmission to requesters, the large size of animated image files makes them difficult to handle.

Thus, there is a need for improved techniques for transmission and storage of animated image files.

SUMMARY OF THE INVENTION

The invention pertains to techniques for condensing or reducing animated image data streams to enable the transmission and storage of animated images in a rapid and efficient manner.

Animated images are normally stored as image files that includes a series of images that are sequentially displayed. These animated image files are often used by Internet sites to provide animation to their web pages. However, in the case of a proxy server that is required to store large amounts of data for caching purposes, there is a need to reduce the size of the files being stored not only to reduce image storage space but also to accelerate the delivery of these images to an end user that has requested the same. The invention operates to condense or reduce the file size of these animated image files. The invention is effective even when the animated images are compressed.

The invention is particularly well suited for use in reducing or condensing animated GIF images. The invention is also particularly well suited for use in a proxy system for a network (e.g., the Internet).

The invention can be implemented in numerous ways, including as a method, an apparatus, a system, or computer readable medium. Several embodiments of the invention are summarized below.

As a method for reducing file size of an animated GIF file, one embodiment of the invention includes the operations of: receiving an animated GIF file having a first file size, the received animated GIF file including at least a plurality of control blocks and a plurality of image blocks; selecting at least one of the image blocks to be discarded; discarding the at least one of the selected image blocks and the at least one of the control blocks associated therewith; modifying the control blocks associated with one or more of the image blocks remaining after the discarding operation; and thereafter storing a resultant animated GIF file having a second file size, the second file size being reduced as compared to the first file size. Optionally, when the animated GIF file includes a least one comment block, the invention can also operate to remove one or more comment blocks from the received animated GIF file prior to storing of the resultant animated GIF file.

As a computer readable media for reducing file size of an animated image file, one embodiment of the invention includes: first computer program code for receiving an animated image file having a first file size, the received animated image file including at least a plurality of control blocks and a plurality of image blocks; second computer program code for selecting at least one of the image blocks to be discarded; third computer program code for discarding the at least one of the selected image blocks and the at least one of the control blocks associated therewith; and fourth computer program code for storing a resultant animated image file having a second file size, the second file size being reduced as compared to the first file size.

As a proxy system for distributing and storing animated image files, one embodiment of the invention includes a proxy server and an acceleration unit. The proxy server operates to receive a request for an animated image from a network browser, to acquire the requested animated image from a network content server or a local storage device, and to manage the forwarding of the requested animated image to the network browser. The acceleration unit is coupled to the proxy server and operates to pre-fetch the requested animated image having an original size from a content provider coupled to the network, reduce the size of the retrieved animated image to a reduced size, store the retrieved animated image with the reduced size, and provide the requested animated image with the reduced size to the proxy server.

The advantages of the invention are numerous. One advantage of the invention is that animated images are able to be more efficiently and rapidly transmitted. Another advantage is that animated images are able to be more efficiently stored and retrieved from a cache (e.g., image store). Still another advantage is that the condensed or reduced size animated images remain animated. Yet another advantage of the invention is that the animated images can be reduced or condensed even while already being compressed. Another advantage of the invention is that the processing to perform the reducing or condensing is computationally fast and individual image quality need not be sacrificed.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention pertains to techniques for condensing or reducing animated image data streams to enable the transmission and storage of animated images in a rapid and efficient manner.

Animated images are normally stored as image files that include a series of images that are sequentially displayed. These animated image files are often used by Internet sites to provide animation to their web pages. However, in the case of a proxy server that is required to store large amounts of data for caching purposes, there is a need to reduce the size of the files being stored not only to reduce image storage space but also to accelerate the delivery of these images to an end user that has requested the same. The invention operates to condense or reduce the file size of these animated image files. The invention is effective even when the animated images are compressed.

The invention is particularly well suited for use in reducing or condensing animated GIF images. The invention is also particularly well suited for use in a proxy system for a network (e.g., the Internet).

Embodiments of the invention are discussed below with reference to FIGS. 1–7. However, those skilled in the art will readily appreciate that the detailed description given herein with respect to these figures is for explanatory purposes as the invention extends beyond these limited embodiments.

Figure 1:
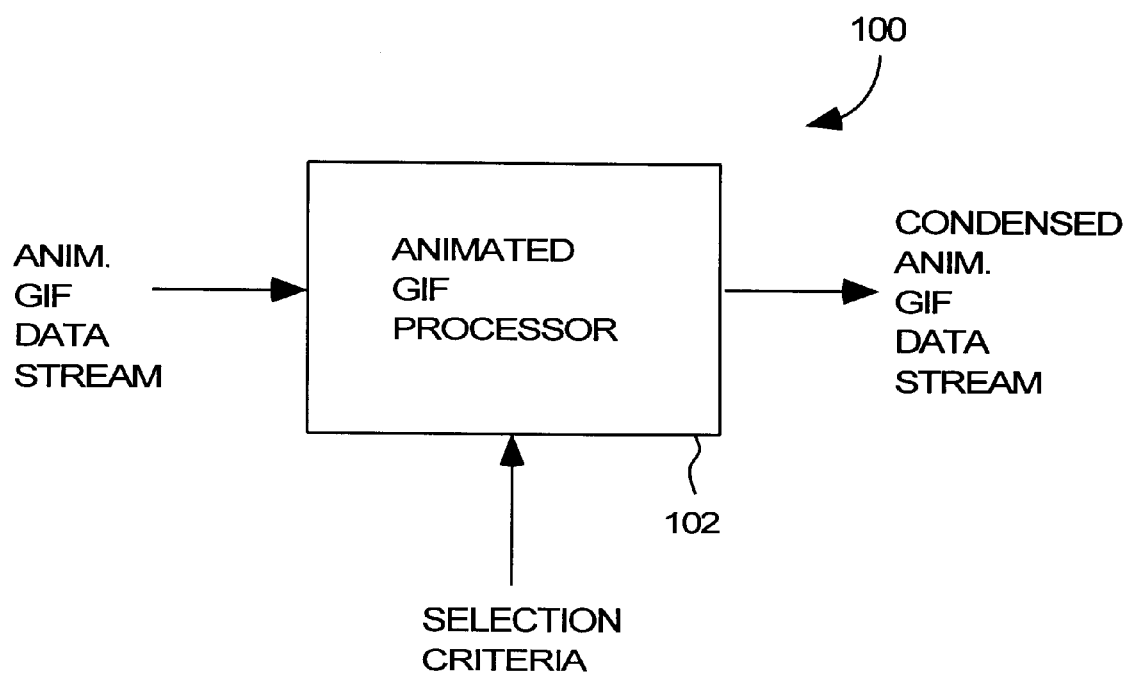
FIG. 1 is a basic block diagram of an image processing system according to a basic embodiment of the invention.

FIG. 1 is a basic block diagram of an image processing system 100 according to a basic embodiment of the invention. The image processing system 100 includes an animated GIF processor 102. The animated GIF processor 102 receives an animated GIF data stream that can be provided by any of a variety of different sources. For example, the animated GIF data stream can be provided by a server computer (e.g., a proxy server) that receives the animated GIF data stream from a content server on a network (e.g., the Internet). The animated GIF processor 102 operates to condense or reduce the size of the animated GIF data stream by selectively discarding portions of the animated GIF data stream while preserving its animation characteristics. The manner in which the animated GIF data stream is condensed or reduced is able to be fixed or controlled in accordance with selection criteria provided to the animated GIF processor 102. The selection criteria can include a number of different approaches, such as discarding every other image, maintaining first and last images and discarding alternate images in between, discarding every third image, etc. The selection criteria can also take into consideration control information provided in the animated GIF data stream, such as discarding those images displayed for shorter periods of time. In any event, the output of the GIF processor 102 is a condensed animated GIF data stream. The condensed animated GIF data stream has a file size that is substantially smaller than the file size associated with the animated GIF data stream originally provided. The condensed animated GIF data stream remains animated, though the animation is not as robust as the animation of the original animated GIF data stream.

Figure 2:
FIG. 2 is a diagram of an exemplary animated GIF data stream.

FIG. 2 is a diagram of an exemplary animated GIF data stream 200. The exemplary animated GIF data stream 200 includes a header (H), a logical screen descriptor (LSD), a global palette (GP), an application extension block (AE), a first comment (C1), a second comment (C2), a first control block (CNTL-1), a first image block (IMAGE-1), a third comment (C3), and subsequent sequential pairs of control blocks and image blocks (CNTL-2, IMAGE-2, . . . CNTL-n, IMAGE-n), and finally a trailer (T). Additional details on animated GIF images can be found in GIF89a which is a GIF image format for animated images, and which is hereby incorporated by reference.

Figure 3:
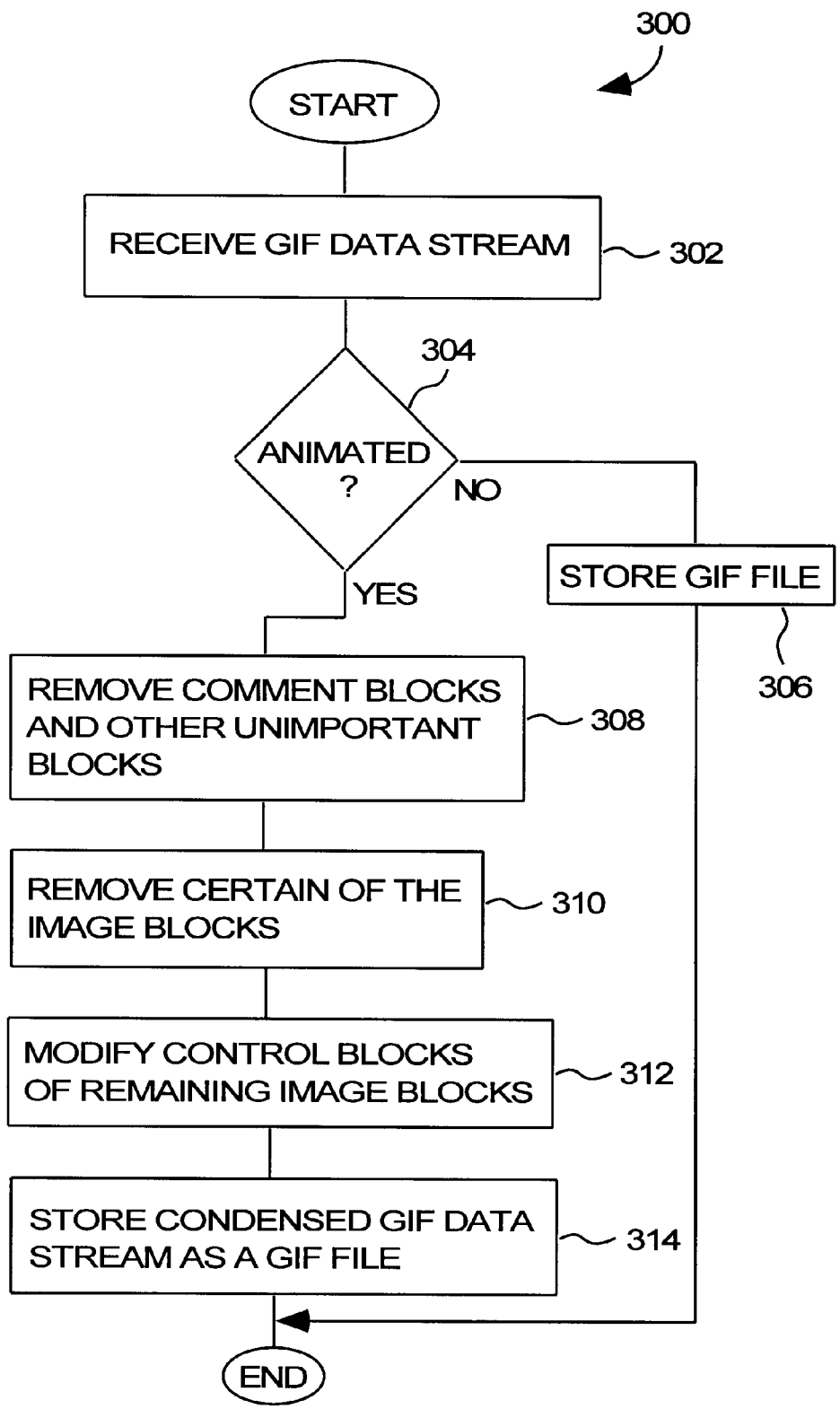
FIG. 3 is a flow diagram of animated image reduction processing according to an embodiment of the invention.

FIG. 3 is a flow diagram of animated image reduction processing 300 according to an embodiment of the invention. The animated image reduction processing 300 is described below in the case where the animated image is provided as a GIF file. However, it should be recognized that the animated image can have other formats besides GIF.

The animated image reduction processing 300 initially receives 302 a GIF data stream. As noted above, the GIF data stream can be received from any of a number of different sources, including a content server on the Internet, a server on an intranet, a local disk drive, etc. Normally, the GIF data stream is provided by a GIF file stored locally or remotely. Next, a decision block 304 determines whether the GIF data stream that has been received is animated. When the decision block determines that the GIF data stream received is not animated, then the GIF data stream is simply stored 306 as a GIF file with its original size. Following the storage 306 of the GIF file with its original size, the animation image reduction processing 300 ends because, in this case, the GIF file is not associated with an animated GIF file and therefore the animated image reduction processing 300 is not effective to reduce its size.

On the other hand, when the decision block 304 determines that the GIF data stream that has been received is an animated GIF data stream, then the animated image reduction processing 300 is able to substantially reduce the size of the animated GIF data stream. In this case, the animated image reduction processing 300 operate as follows to reduce the size of the animated GIF data stream. Initially, comment blocks and other unimportant blocks are removed 308 from the animated GIF data stream. Next, certain of the image blocks within the GIF data stream are removed 310. Preferably, the certain of the image blocks to be removed are determined in accordance with selection criteria. The removal 308 of the comment blocks and other unimportant blocks as well as the removal 310 of the certain of the image blocks both assist in the reduction of the size of the animated GIF data stream. The control blocks of the remaining image blocks are also modified 312. The modifying of the control blocks operates to improve the viewability of the animated GIF image so that the distortion caused by the removal 310 of certain of the image blocks does not destroy the essential character of the animated GIF data stream. Next, the condensed GIF data stream is stored 314 as a GIF file. Following the storage 314 of the condensed GIF data stream in the GIF file, the animation image reduction processing 300 is complete and ends because, in this case, the GIF data stream is effectively reduced in size by the animated image reduction processing 300.

Figure 4A:
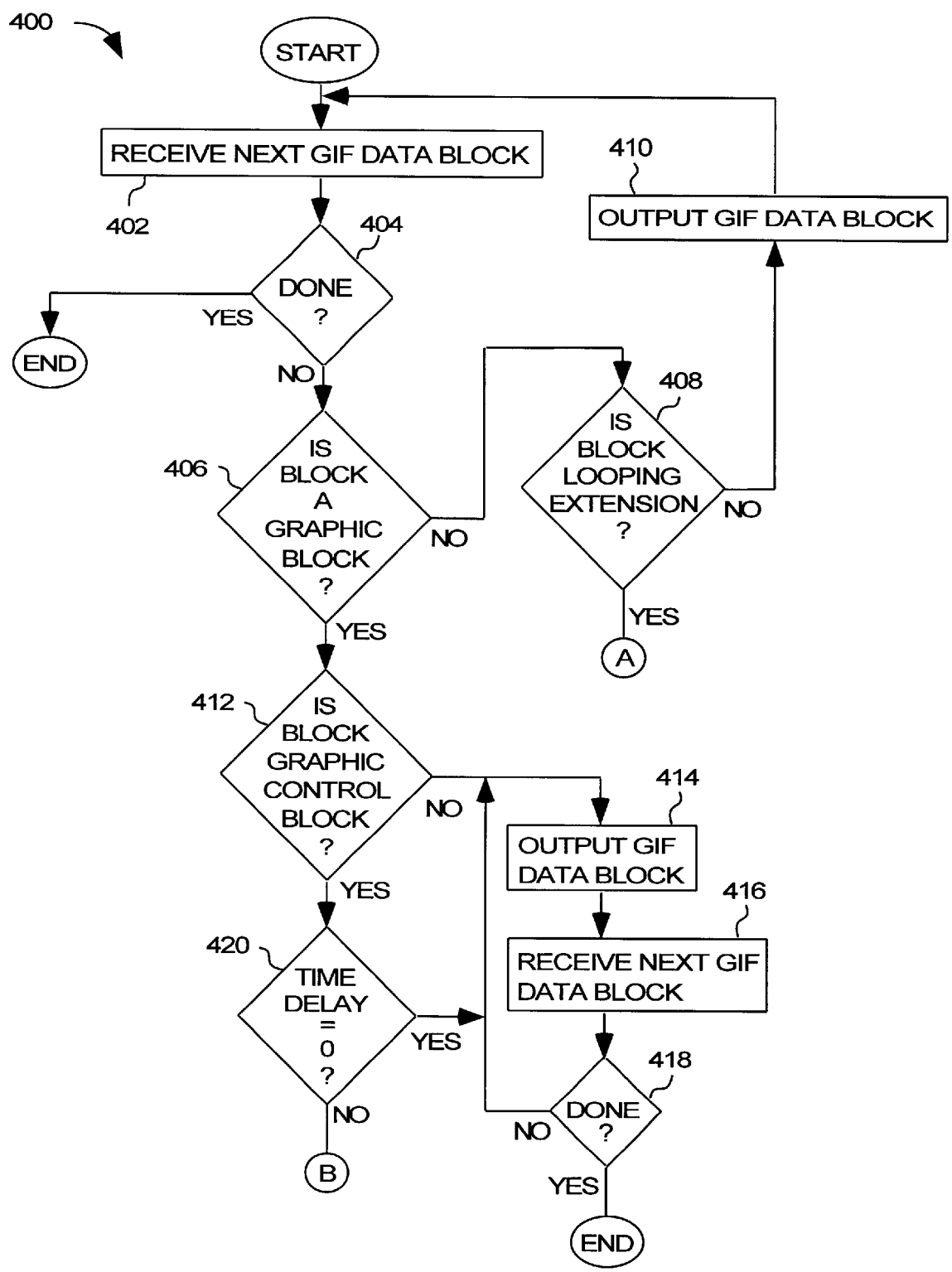
FIGS. 4A and 4B are flow diagrams of animated GIF reduction processing according to an embodiment of the invention.
Figure 4B:
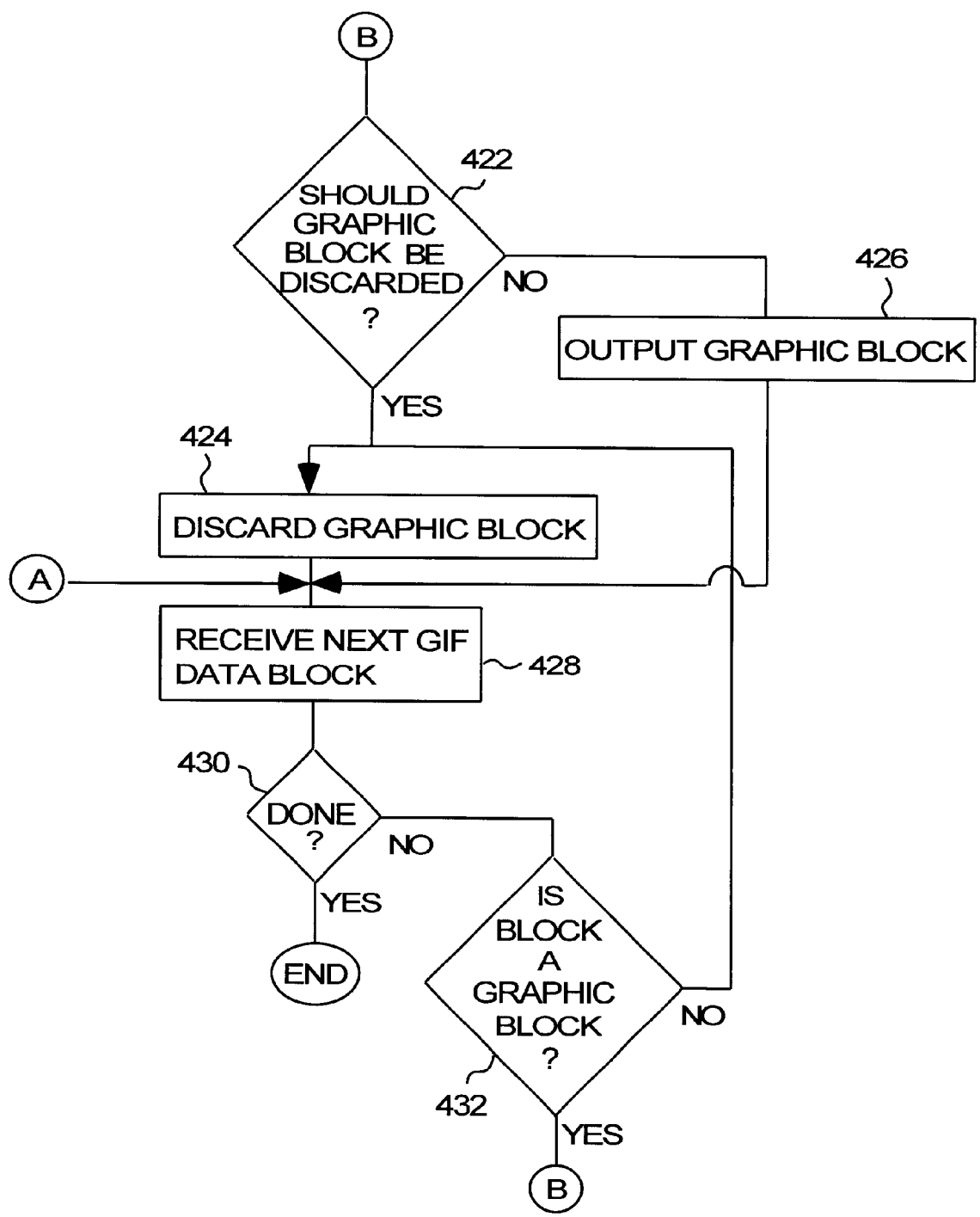

FIGS. 4A and 4B are flow diagrams of animated GIF reduction processing 400 according to an embodiment of the invention. The animated GIF reduction processing 400 initially receives 402 a next GIF data block from a GIF data stream. A decision block 404 then determines whether the GIF data stream has been fully processed. If the decision block 404 determines that the GIF data stream has been fully processed, then the animated GIF reduction processing 400 is complete and ends.

On the other hand, when there are additional GIF data blocks to be processed, then animated GIF reduction processing 400 continues. When the processing continues, a decision block 406 determines whether the GIF data block being processed is a graphic block. When the decision block 406 determines that the GIF data block is not a graphic block, then a decision block 408 determines whether the GIF data block is a looping extension. The looping extension is a particular type of application extension block that is often used with animated GIF images. Hence, when the decision block 408 determines that the GIF data block being processed is a looping extension, then the animated GIF reduction processing 400 understands that the image being processed is an animated GIF image, and thus the processing outputs 409 the looping extension block and then jumps to block 428 which is discussed below. Instead, when the decision block 408 determines that the GIF data block being processed is not a looping extension, then the GIF data block is output 410 and then processing returns to repeat block 402 and subsequent blocks.

Alternatively, when the decision block 406 determines that the GIF data block is a graphic block, then a decision block 412 determines whether the graphic block is a graphic control block. When the decision block 412 determines that the graphic block is not a graphic control block, then the GIF data block is output 414. Then, a next GIF data block is received 416 from the GIF data stream. Thereafter, a decision block 418 determines whether the GIF data stream has been fully processed. If the decision block 418 determines that the GIF data stream has been fully processed, then the animated GIF reduction processing 400 is complete and ends.

Instead, when the decision block 418 determines that the GIF data stream has not been fully processed, then the processing returns to repeat block 414 and subsequent blocks. In this case, the animated GIF reduction processing 400 has determined that the GIF data stream lacks a graphic control block and thus is not associated with an animated GIF image. Hence, in this situation, blocks 414 through 418 repeat until the remaining portions of the GIF data stream are output block by block.

On the other hand, when the decision block 412 determines that the graphic block is a graphic control block, then a decision block 420 determines whether a time delay associated with the graphic control block is zero (0). When the time delay is determined to be zero (0), then GIF data stream is again determined not to be associated with an animated GIF image, thus the processing jumps to block 414 and subsequent blocks where the remaining GIF data blocks of the GIF data stream are output. Alternatively, when the decision block 420 determines that the time delay is not equal to zero (0), then the animated GIF reduction processing 400 has determined that the GIF data stream is actually an animated GIF data stream and thus the reduction processing techniques provided by the invention can be used to reduce the file size associated with the GIF image.

Specifically, following the decision block 420 when the time delay is not equal to zero (0), a decision block 422 determines whether the graphic block should be discarded. The decision block 422 can make the decision as to whether the graphic block should be discarded in a variety of different ways. For example, alternate graphic blocks could be discarded or every certain number of blocks could be discarded or random graphic blocks could be discarded. In any case, when the decision block 422 determines that the graphic block should be discarded, then the graphic block is discarded 424. On the other hand, when the decision block 422 determines that the graphic block should not be discarded, then the graphic block is output as part of the condensed animated GIF data stream.

Following either block 424 or 426, as well as following the decision block 408 when the GIF data block is determined to be in a looping extension, the animated GIF reduction processing 400 receives 428 a next GIF data block from the GIF data stream. Then, a decision block 430 determines whether the GIF data stream has been fully processed. If the decision block 430 determines that the GIF data stream has been fully processed, then the animated GIF reduction processing 400 is complete and ends. On the other hand, when the decision block 430 determines that the GIF data stream has not been fully processed, then a decision block 432 determines whether the GIF data block that has been received is a graphic block. When the decision block 432 determines that the GIF data block is a graphic block, then processing returns to repeat the decision block 422 and subsequent blocks to determine whether the graphic block should be discarded. Alternatively, when the decision block 432 determines that the GIF data block is not a graphic block, then processing returns to repeat block 424 and subsequent blocks. Hence, in the processing associated with blocks 422 through 432, graphic blocks are discarded in accordance with a selection criteria, whereas other blocks that are not graphic blocks are simply discarded.

Figure 5:
FIG. 5 is an exemplary GIF data stream that has been reduced or condensed in accordance with an embodiment of the invention.

FIG. 5 is an exemplary GIF data stream 500 that has been reduced or condensed in accordance with an embodiment of the invention. The exemplary GIF data stream 500 represents a reduced version of the GIF data stream 200 illustrated in FIG. 2. As will be noted, the animated GIF reduction processing according to an embodiment of the invention has reduced the size (file size) of the animated GIF data stream substantially. Namely, the comments C1, C2 and C3 have been removed from the animated GIF data stream 200 when producing the animated GIF data stream 500. Furthermore, alternative ones of the associated control blocks and image blocks are discarded from the animated GIF data stream 200 when producing the animated GIF data stream 500. Hence, the total number of control blocks and image blocks is reduced by approximately one-half. Following the control blocks and image blocks, a trailer (T) is provided. Hence, the number of control blocks and image blocks in the animated GIF data stream 500 is approximately one-half (e.g., n/2) that of the control blocks and image blocks used in the animated GIF data stream 200. Thus, the invention provides substantial reductions in the size of the animated GIF data streams and their associated image files.

As a result, the animated GIF data streams are able to be downloaded or forwarded to a requesting user from a proxy server with a substantially improved transfer time. Further, although not shown in FIG. 5, the invention may also alter the timing controls that are present within the control blocks 1, 3, . . . n/2, so that the animation sequencing is substantially maintained as it was in the original animated GIF data stream even though less images are sequenced.

An example of a typical conventional animation file is as follows:
  GIF89A HEADER
  LOGICAL SCREEN DESCRIPTOR
  GLOBAL PALETTE
  LOOP: Netscape 2.0 Loop
  COMMENT "Created By . . . "
  COMMENT "Star at 0 degrees"
  CONTROL for IMAGE #1
  IMAGE #1
  COMMENT "Star at 15 degrees"
  CONTROL for IMAGE #2
  IMAGE #2
  COMMENT "Star at 30 degrees"
  CONTROL for IMAGE #3
  IMAGE#3
  TRAILER An example of a condensed version of the animated file produced in accordance with an embodiment of the invention is as follows:
  GIF89A HEADER
  LOGICAL SCREEN DESCRIPTOR
  GLOBAL PALETTE
  LOOP: Netscape 2.0 Loop
  CONTROL for IMAGE #1 (modified)
  IMAGE #1
  CONTROL for IMAGE #3 (modified)
  IMAGE #3
  TRAILER Note that Image #2 block and Control for Image #2 block are both removed from the condensed version (e.g., block 310 of FIG. 3 or block 424 of FIG. 4B). Also, the comment blocks are removed from the condensed version (e.g., block 308 of FIG. 3 or block 424 of FIG. 4B). Still further, the Control for Image #1 block and the Control for Image #3 block are both modified to adjust the timing controls. For example, if originally the timing controls for the Control for Image #1 block, the Control for Image #2 and the Control for Image #3 indicate a display time for each associated image of ten (10) seconds, then the modification could modify the Control for Image #1 block and the Control for Image #3 block to provide a display time of fifteen (15) seconds each, thereby substantially maintaining the animation sequencing.

Figure 6:
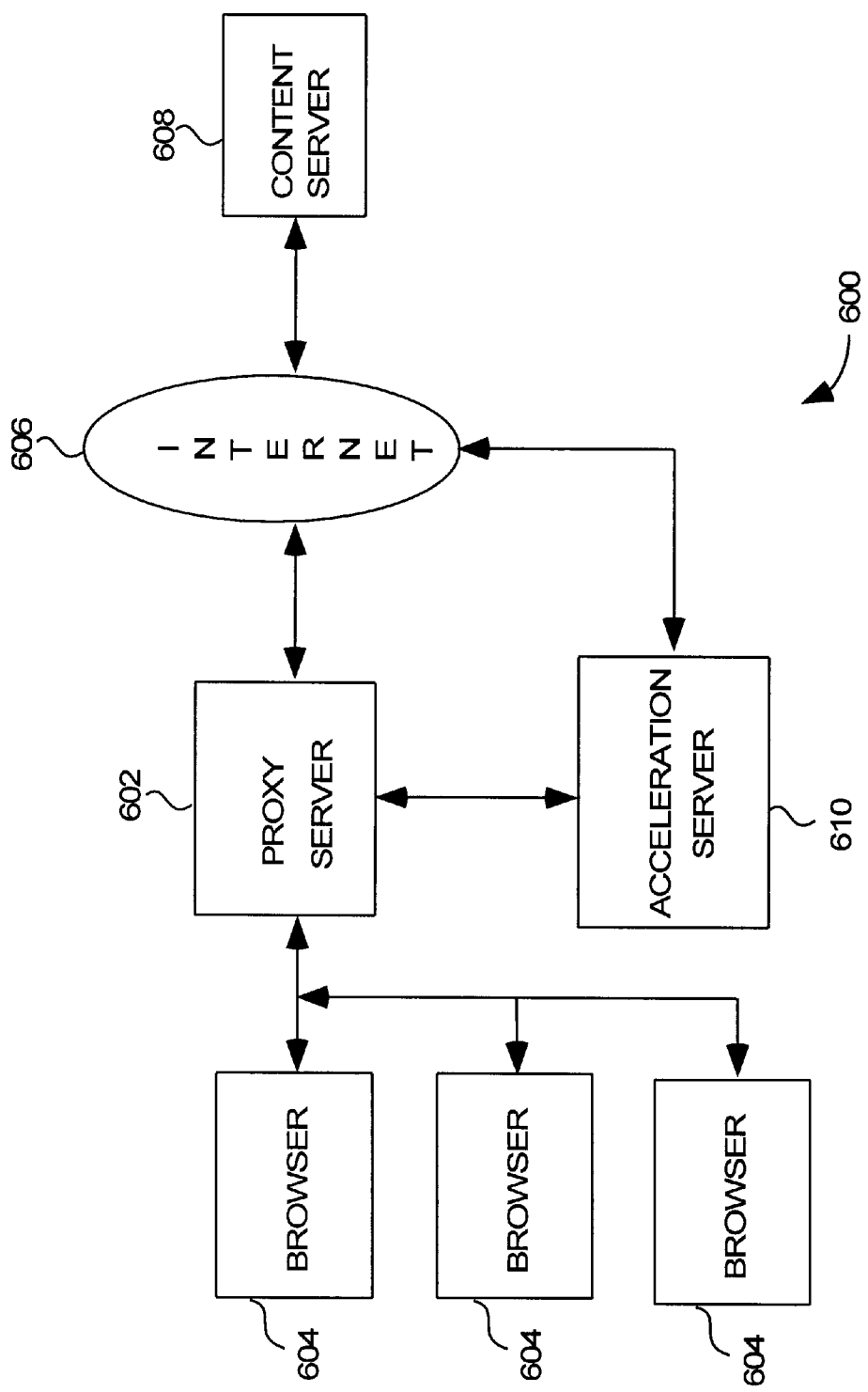
FIG. 6 is a proxy system that provides improved data delivery over a network according to an embodiment of the invention.

FIG. 6 is a proxy system 600 that provides improved data delivery over a network. The proxy system 600 includes the proxy server 602 that couples to network browsers 604. The proxy server 602 is also coupled to the Internet 606. The Internet 606 is a collection of interconnected computer systems, some of which act as content servers. Accordingly, FIG. 6 illustrates the Internet 606 coupled to a content server 608 as a representative one of the content servers associated with the Internet 606. Additionally, the proxy system 600 includes an acceleration server 610. The acceleration server 610 couples to the proxy server 602 as well as the Internet 606.

The proxy system 600 is able to provide improved content (data) delivery over the Internet 606. Namely, the proxy system 600 operates to speed up the response time that a user of one of the browsers 604 undergoes after requesting some content from the content server 608 until the requested content is supplied to the user at the one of the browsers 604.

The general operation of the proxy system 600 is as follows. Normally, a user of one of the browsers 604 makes a request for data from a content server on the Internet 606. The proxy server 602 initially intercepts the request for data from the browser 604 and determines whether the request for data can be satisfied locally by the proxy server 602 or accelerated by the acceleration server 610. When the proxy server 602 determines that the request for data cannot be satisfied locally or accelerated, the proxy server 602 forwards the request for data to the content server 608 through the Internet 606. In this case, the previously intercepted request for data is passed through the proxy server 602 to the content server 608 via the Internet 606 so that the request for data can be satisfied in a conventional, unaccelerated manner. Alternatively, when the proxy server 602 determines that the request for data can be satisfied locally but not accelerated, then the proxy server 602 operates to satisfy the request for data using information locally stored; thereby avoiding the need to traverse the sluggish Internet 606 and retrieve the requested data from the content server 608.

On the other hand, when the proxy server 602 determines that the request for data can be satisfied locally with an improved response time (i.e., accelerated delivery) to the user, then the proxy server 602 and the acceleration server 610 operate to satisfy the request for data using information locally stored, thereby avoiding the need to traverse the sluggish Internet 606 and retrieve the requested data from the content server 608. Also, if the acceleration server 610 believes it can satisfy the request for data locally but the necessary information is not yet locally available, then the acceleration server 610 operates to retrieve the requested data from the content server 608 with a pre-fetch operation and then locally store the necessary information. Thereafter, the acceleration server 610 can satisfy the request for data from local storage. In either of these cases, the data returned to the browser 604 in response to the request for data will not only be locally available but also be reduced in size (e.g. reduced file size). Both of these features contribute to the ability of the proxy system 600 to significantly improve the response time in which the requested data can be delivered to the browser 604.

Accordingly, the proxy server 602 acting together with the acceleration server 610 is able to accelerate the delivery of the requested data to the user of the browser 604 that has made the request. The content typically includes images and sometimes animated images. In the case of animated images, the above-described techniques for condensing or reducing the animated images are used by the acceleration server 610 to condense or reduce the file size of the animated images such that they can be locally stored in less space or rapidly transmitted to the browser 604 as at least a portion of the requested data.

Thus, the addition of the acceleration server 610 to the proxy system 600 allows the delivery of requested data to be delivered to a user in an accelerated manner. The acceleration is provided by local storage and by producing accelerated versions of the content. The local storage can locally store not only accelerated versions of content but also original (unaccelerated) versions of content.

Figure 7:
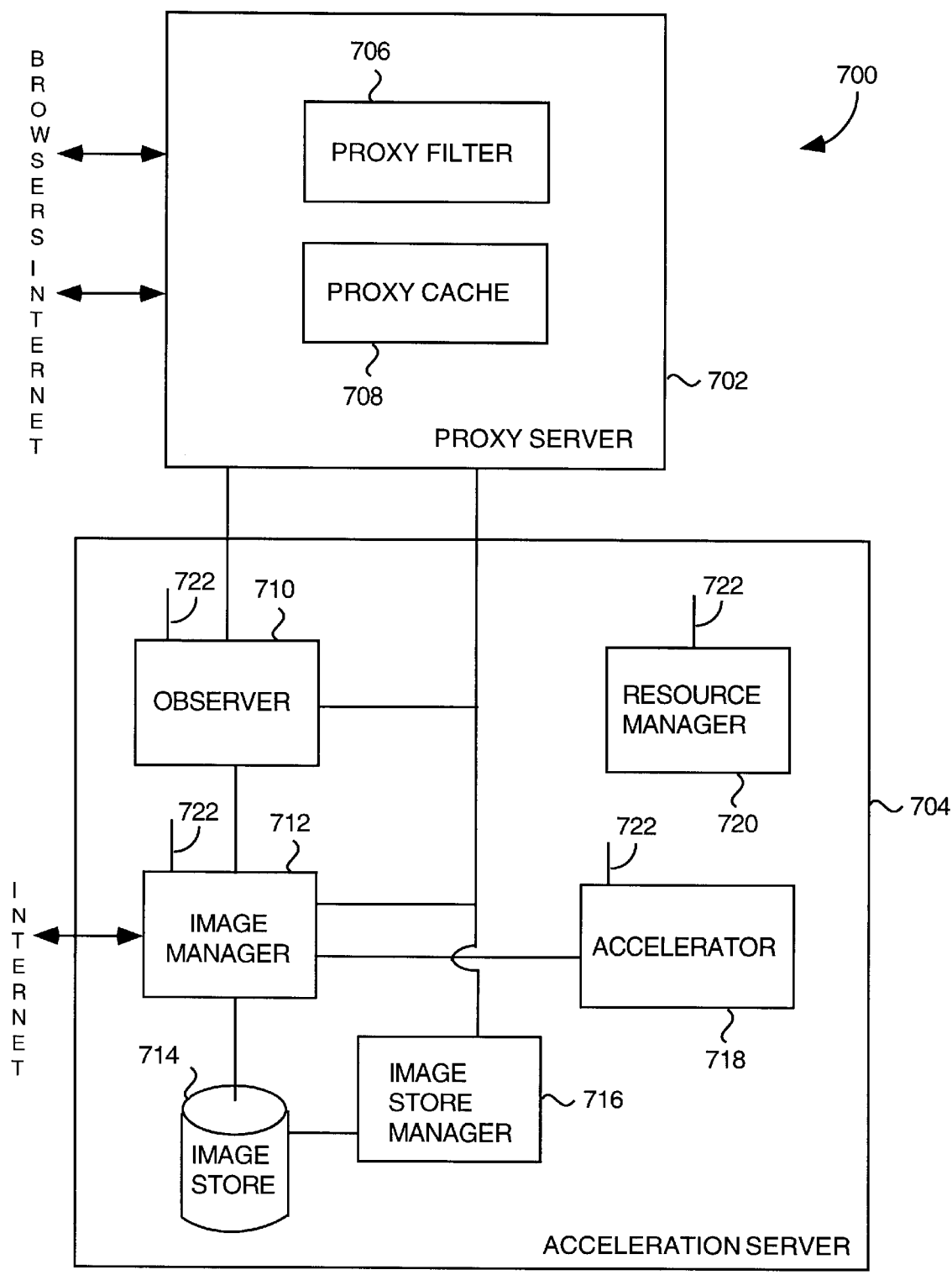
FIG. 7 is a block diagram of a proxy system according to an embodiment of the invention.

FIG. 7 is a block diagram of a proxy system 700 according to an embodiment of the invention. The proxy system 700 includes a proxy server 702 and an acceleration server 704. As an example, the proxy server 702 can correspond to the proxy server 602 illustrated in FIG. 6, and the acceleration server 704 can correspond to the acceleration server 610 in FIG. 6.

The proxy server 702 includes a proxy filter 706 and a proxy cache 708. The proxy filter 706 monitors requests for data received from the browsers 604. The proxy filter 706 then filters out those requests that it believes it can accelerate the delivery of t he re quested data to the user of the browsers 604. The proxy filter 706 then forwards these requests that it believes it can accelerate to the acceleration server 704. The proxy cache 708 operates as a cache storage area in which responses to earlier requests from the Internet 606 made by the browsers 604 can be temporarily saved and satisfied thereafter from the proxy cache 708 if any of the browsers 604 make the same request for data while the data remains stored in the proxy cache 708. Hence, the proxy cache 708 provides local storage for content data that was previously requested by one of the browsers 604, and thus provides rapid access to the same content data as long as the content data remains stored in the proxy cache 708. However, the content stored in the proxy cache 708 is not accelerated, but merely nonaccelerated content obtained by the proxy server 702 from a content server through the Internet 606.

It should be noted that conventional proxy servers include a cache to temporarily store content obtained from a content server via the Internet. An example of such a conventional proxy server is Microsoft Proxy Server, produced by Microsoft Corporation. Hence, the proxy server 702 includes the proxy cache 708 because the proxy system 700 according to the invention can be built using a conventional proxy server suitably modified to include primarily the proxy filter 706. In other words, the proxy cache 708 need not be included in the proxy server 702 of the proxy system 700 or if provided can be disabled or used in conjunction with the acceleration server 704.

The proxy filter 706 supplies those of the data requests it believes it can accelerate to the acceleration server 704. For example, a data request (e.g., World Wide Web page request) can be evaluated to determine if it includes images. Given that images are separate files that tend to have relatively large file sizes, images are good candidates for acceleration. Hence, a data request associated with one or more images files (such as many World Wide Web pages) is an example of a data request that the proxy filter 706 would believe it could accelerate. Also, another common data request would be an image request (e.g., GET image request in HTTP) for a particular image file from a content server via the Internet. The proxy filter 706 would also believe it could accelerate the delivery of such image files.

The acceleration server 704 includes various components to perform processing operations used in producing and/or supplying an accelerated response to a data request back to the proxy server 702. The major components of the acceleration server 704 are illustrated in FIG. 7 and discussed below.

An observer 710 receives a data request via the proxy filter 706. The observer 710 examines the data request to identify images associated therewith. In this embodiment, the acceleration server 704 is operating to accelerate the delivery of images to the browser 604 that made the request for data that is or includes the images. The identified images are then forwarded to an image manager 712. The image manager 712 determines whether the desired images are already stored in an image store 714. The image manager 712 can determine those images already stored in the image store 714 using an image store manager 716. If the desired images are already stored in the image store 714 when requested by the requesting browser 604, copies of the desired images are supplied from the image store 714 to the proxy server 702 and then forwarded from the proxy server 702 to the requesting browser 604. On the other hand, if the image manager 712 determines that the requested images are not yet stored in the image store 714, then the images can be obtained directly from the Internet by the image manager 712 using a high speed connection.

Once retrieved, the images are evaluated to determine whether they can be accelerated by an accelerator 718. If the images can be accelerated, then the accelerator 718 produces an accelerated version of the image and stores the accelerated version in the image store 714. Additionally, the image manager 712 can also store an original version of the image in the image store 714. Thereafter, the proxy server 702 can return the requested image to the requesting browser 604 in a rapid manner when requested by the requesting browser 604. When the proxy server 702 has an accelerated version of the image to return to the browser 604, the response time to the browser 604 is even further improved by the proxy system 700. Namely, the time to transmit a file (e.g., image file) from the proxy system 700 to one of the browsers 604 is proportional to file size. Therefore, given that the accelerated versions have a smaller size, the accelerated versions can be transmitted to the browsers 604 in a reduced amount of time (i.e., improved response time). Also, in cases of excessive processing load, the acceleration server 704 can take appropriate action to reduce the processing load due to production of accelerated versions so that the overall responsiveness of the proxy system 700 is not hindered even in worst case conditions.

The image store 714 provides storage for images and provides image data to requesting other components of the proxy system 700. Additionally, as noted above, the image store 714 is also associated with an image store manager 716 that manages the allocation of slots, the removing of old slots, and provides state management of slots and objects.

The images stored in the image store 714 include original versions of images that have been retrieved from a content server (e.g., original versions) and accelerated versions of these images. More particularly, within each slot provided in the image store 714, a collection of information is provided, including HTTP request and response entities, validity information (used to implement HTTP cache coherency algorithms), statistics information, and a collection of related objects (e.g., images). Typically, the collection of related objects includes an original object and one or more accelerated objects. Associated with each object is not only the object data itself but also object state information (e.g., loading, done, etc.).

Generally, the image store 714 can operate to provide the following functions: creation of the slot, adding an object to the slot, streaming data to fill an object within a slot, retrieval of an object from a slot, and checking if a slot is within the image store 714. Additionally, in the background mode, the image store 714 in conjunction with the image store manager 716 can also function to perform validity checking, storage management, and slot and object state management. Normally, to prevent the image store 714 from filling up and remaining full, the slots within the image store 714 should be recycled periodically to manage the space for storage provided by the image store 714. The image store 714 can also maintain and implement a HTTP proxy cache coherency protocol for all images stored in the image store 714.

The image store 714 can be created in a number of different ways. For example, the image store can be implemented as a proxy cache, a database or a HTTP server with extensions, or some combination of the foregoing. Further, the image store 714 can also be accessed by a common standard interface that is usable by the other components of the proxy system 700. In one embodiment, the interface is achieved by an image store plug-in (e.g., a DLL or a shared library), and the image store 714 uses a database and a MS PROXY 2.0 to implement the image store 714.

The advantages of the invention are numerous. One advantage of the invention is that animated images are able to be more efficiently and rapidly transmitted. Another advantage of the invention is that animated images are able to be more efficiently stored and retrieved from a cache (e.g., image store). Still another advantage of the invention is that the condensed or reduced size animated images remain animated. Yet another advantage of the invention is that the animated images can be reduced or condensed even while already being compressed. Another advantage of the invention is that the processing to perform the reducing or condensing is computationally fast and individual image quality need not be sacrificed.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for reducing file size of an animated GIF file, said method comprising:
    (a) receiving an animated GIF file having a first file size, the received animated GIF file including at least a plurality of control blocks and a plurality of image blocks;
    (b) selecting at least one of the image blocks to be discarded;
    (c) discarding the at least one of the selected image blocks and the at least one of the control blocks associated therewith;
    (d) modifying the control blocks associated with one or more of the image blocks remaining after said discarding (c); and
    (e) thereafter storing a resultant animated GIF file having a second file size, the second file size being reduced as compared to the first file size.

2. A method as recited in claim 1, wherein the animated GIF file further includes a least one comment block, and
    wherein said method further comprises (f) removing the at least one comment block from the received animated GIF file prior to said storing (e) of the resultant animated GIF file.

3. A method as recited in claim 1, wherein besides the plurality of control blocks and the plurality of image blocks, the animated GIF file includes a header block, a logical screen descriptor block, a color palette block, an application extension block, and a trailer.

4. A method as recited in claim 1, wherein said selecting (b) of at least one of the image blocks to be discarded selects alternate ones of the image blocks to be discarded.

5. A method as recited in claim 4, wherein the animated GIF file further includes a least one comment block, and
    wherein said method further comprises (f) removing the at least one comment block from the received animated GIF file prior to said storing (e) of the resultant animated GIF file.

6. A method as recited in claim 5, wherein besides the plurality of control blocks and the plurality of image blocks, the animated GIF file includes a header block, a logical screen descriptor block, a color palette block, an application extension block, and a trailer.

7. A method as recited in claim 1, wherein said selecting (b) of at least one of the image blocks to be discarded comprises:
    (b1) determining a control time amount for each of the plurality of the image blocks from the control blocks associated therewith; and (b2) selecting alternate ones of the image blocks to be discarded unless the control time amount for the otherwise selected one of the image blocks exceeds a predetermined threshold amount.

8. A method as recited in claim 1, said modifying (d) of the control blocks associated with one or more of the image blocks remaining after said discarding (c) comprises:
   (d1) determining a control time amount associated with each of the control blocks being discarded; and
   (d2) distributing the control time amount among the control blocks associated with one or more of the image blocks remaining after said discarding (c).

9. A method as recited in claim 8, wherein the animated GIF file further includes a least one comment block, and
   wherein said method further comprises (f) removing the at least one comment block from the received animated GIF file prior to said storing (e) of the resultant animated GIF file.

10. A method as recited in claim 1, wherein said selecting (b) of at least one of the image blocks to be discarded comprises:
    (b1) determining a control time amount for each of the plurality of the image blocks from the control blocks associated therewith; and
    (b2) selecting alternate ones of the image blocks to be discarded unless the control time amount for the otherwise selected one of the image blocks exceeds a predetermined threshold amount.

11. A method as recited in claim 8, wherein said selecting (b) of at least one of the image blocks to be discarded selects alternate ones of the image blocks to be discarded.

12. A method as recited in claim 11, wherein besides the plurality of control blocks and the plurality of image blocks, the animated GIF file includes a header block, a logical screen descriptor block, a color palette block, an application extension block, and a trailer.

13. A computer readable media for reducing file size of an animated image file, said computer readable media comprising:
    first computer program code for receiving an animated image file having a first file size, the received animated image file including at least a plurality of control blocks and a plurality of image blocks;
    second computer program code for selecting at least one of the image blocks to be discarded;
    third computer program code for discarding the at least one of the selected image blocks and the at least one of the control blocks associated therewith; and
    fourth computer program code for storing a resultant animated image file having a second file size, the second file size being reduced as compared to the first file size.

14. A computer readable media as recited in claim 13, wherein said second computer code that selects at least one of the image blocks to be discarded selects alternate ones of the image blocks to be discarded.

15. A computer readable media as recited in claim 13, wherein the animated image file further includes a least one comment block, and
    wherein said computer readable media further comprises fifth computer program code for removing the at least one comment block from the received animated image file prior to storing the resultant animated image file by said fourth computer program code.

16. A computer readable media as recited in claim 13, wherein besides the plurality of control blocks and the plurality of image blocks, the animated image file includes a header block, a logical screen descriptor block, a color palette block, an application extension block, and a trailer.

17. A computer readable media as recited in claim 13, wherein said second computer code that selects at least one of the image blocks to be discarded comprises:
    computer program code for determining a control time amount for each of the plurality of the image blocks from the control blocks associated therewith; and
    computer program code for selecting alternate ones of the image blocks to be discarded unless the control time amount for the otherwise selected one of the image blocks exceeds a predetermined threshold amount.

18. A computer readable media as recited in claim 13, wherein said computer readable media further comprises:
    fifth computer program code for modifying the control blocks associated with one or more of the image blocks remaining after said third computer program code discards the at least one of the selected image blocks and the at least one of the control blocks associated therewith and before said fourth computer program code stores a resultant animated image file.

19. A computer readable media as recited in claim 18, said fifth computer program code comprises:
    computer program code for determining a control time amount associated with each of the control blocks being discarded; and
    computer program code for distributing the control time amount among the control blocks associated with one or more of the image blocks remaining after said third computer program code discards the at least one of the selected image blocks and the at least one of the control blocks associated therewith.

20. A computer readable media as recited in claim 18, wherein the animated image file further includes a least one comment block, and
    wherein said computer readable media further comprises sixth computer program code for removing the at least one comment block from the received animated image file prior to storing the resultant animated image file by said fourth computer program code.

21. A computer readable media as recited in claim 20, wherein said second computer code that selects at least one of the image blocks to be discarded comprises:
    computer program code for determining a control time amount for each of the plurality of the image blocks from the control blocks associated therewith; and
    computer program code for selecting alternate ones of the image blocks to be discarded unless the control time amount for the otherwise selected one of the image blocks exceeds a predetermined threshold amount.

22. A computer readable media as recited in claim 20, wherein said second computer code that selects at least one of the image blocks to be discarded selects alternate ones of the image blocks to be discarded.

23. A proxy system for distributing and storing animated image files, comprising:
    a proxy server, said proxy server operates to receive a request for an animated image from a network browser, to acquire the requested animated image from a network content server or a local storage device, and to manage the forwarding of the requested animated image to the network browser,
    said proxy server being connected to a network through a first connection, and the requested animated image is accessible by said proxy server via the first connection to the network; and an acceleration unit coupled to said proxy server,
said acceleration unit operates to pre-fetch the requested animated image having an original size from a content provider coupled to the network using the second connection, reduce the size of the retrieved animated image to a reduced size, store the retrieved animated image with the reduced size, and provide the requested animated image with the reduced size to said proxy server.

24. A proxy system as recited in claim 23, wherein said acceleration unit reduces the size of the retrieved animated image to the reduced size by the operations of receiving an animated image file, the received animated image file including at least a plurality of control blocks and a plurality of image blocks; and discarding selected one or more of the image blocks and the one or more of the control blocks associated therewith, thus producing the retrieved animated image with the reduced size.

25. A proxy system as recited in claim 24, wherein the requested animated image is an animated GIF file.

26. A proxy system as recited in claim 23, wherein said acceleration unit comprises:
an image manager, said image manager operates to manage the retrieval of the requested animated image having the original size from the content provider;
an accelerator operatively coupled to said image manager, said accelerator operates to receive the requested animated image having the original size from said image manager and then to reduce the size of the requested animated image with the original size so as to produce the requested animated image with the reduced size; and
an image store operatively coupled to said accelerator and said image manager, said image store operates to store at least the requested animated image with the reduced size.

27. A proxy system as recited in claim 26, wherein said accelerator comprises:
means for receiving an animated image file having a first file size, the received animated image file including at least a plurality of control blocks and a plurality of image blocks;
means for selecting at least one of the image blocks to be discarded;
means for discarding the at least one of the selected image blocks and the at least one of the control blocks associated therewith.

28. A proxy system as recited in claim 27, wherein said accelerator further comprises:
means for removing the at least one comment block from the received animated image file prior to storing the resultant animated image file in said image store.

* * * * *